(12) United States Patent
Noda et al.

(10) Patent No.: US 10,866,343 B2
(45) Date of Patent: Dec. 15, 2020

(54) PHOTONIC CRYSTAL AND OPTICAL FUNCTIONAL DEVICE INCLUDING THE SAME

(71) Applicant: JAPAN SCIENCE AND TECHNOLOGY AGENCY, Kawaguchi (JP)

(72) Inventors: Susumu Noda, Kyoto (JP); Ardavan Oskooi, San Francisco, CA (US); Yoshinori Tanaka, Kyoto (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 0 days.

(21) Appl. No.: 14/784,862

(22) PCT Filed: Apr. 15, 2014

(86) PCT No.: PCT/JP2014/060731
§ 371 (c)(1),
(2) Date: Oct. 15, 2015

(87) PCT Pub. No.: WO2014/171457
PCT Pub. Date: Oct. 23, 2014

(65) Prior Publication Data
US 2016/0061994 A1    Mar. 3, 2016

(30) Foreign Application Priority Data
Apr. 17, 2013   (JP) ................. 2013-086902

(51) Int. Cl.
*H01L 31/054* (2014.01)
*G02B 1/00* (2006.01)

(52) U.S. Cl.
CPC ............ *G02B 1/005* (2013.01); *H01L 31/054* (2014.12); *Y02E 10/52* (2013.01)

(58) Field of Classification Search
CPC ......... H01L 31/054; G02B 1/005; G02B 1/00; Y02E 10/52
See application file for complete search history.

(56) References Cited

U.S. PATENT DOCUMENTS

| | | | |
|---|---|---|---|
| 6,829,281 B2 * | 12/2004 | Deng | ..... H01S 5/183 372/43.01 |
| 2005/0056312 A1 * | 3/2005 | Young | ..... H01L 31/0749 136/258 |

(Continued)

FOREIGN PATENT DOCUMENTS

| | | |
|---|---|---|
| CN | 102696114 A | 9/2012 |
| EP | 2 523 220 A1 | 11/2012 |

(Continued)

OTHER PUBLICATIONS

Reininger et al,optimized photonic crystal design for quantum well infrared photodetectors, May 2012.*

(Continued)

*Primary Examiner* — Uyen M Tran
(74) *Attorney, Agent, or Firm* — Oliff PLC

(57) ABSTRACT

An object to provide a photonic crystal capable of resonating light at more resonant frequencies within a particular frequency range. A plurality of photonic crystal structure formation bodies each including a plate-like member in which cyclic refractive index distribution is formed are provided so as to be spaced apart from each other in the thickness direction of the plate-like member, and the respective refractive index distributions of the plurality of photonic crystal structure formation bodies are set such that: at least one of the plurality of photonic crystal structure formation bodies resonates with light having at least two frequencies within the frequency range; and the two frequencies are (Continued)

different from resonant frequencies of at least one of the other photonic crystal structure formation bodies.

13 Claims, 11 Drawing Sheets

(56) References Cited

U.S. PATENT DOCUMENTS

| | | | |
|---|---|---|---|
| 2009/0074024 A1* | 3/2009 | Noda | G11B 7/0903 |
| | | | 372/50.12 |
| 2010/0236620 A1 | 9/2010 | Nakanishi et al. | |
| 2012/0273911 A1* | 11/2012 | Shigeta | H01L 31/02327 |
| | | | 257/432 |
| 2012/0279553 A1* | 11/2012 | Shigeta | H01L 31/03528 |
| | | | 136/246 |
| 2013/0039375 A1 | 2/2013 | Noda et al. | |

FOREIGN PATENT DOCUMENTS

| | | | | |
|---|---|---|---|---|
| EP | 2523219 A1 | 11/2012 | | |
| EP | 2523221 A1 | 11/2012 | | |
| JP | 1122762 A | 5/1995 | | |
| JP | 2001074955 A | 3/2001 | | |
| JP | 2009-076900 A | 4/2009 | | |
| JP | 2011205038 A | 10/2011 | | |
| JP | 2013-041948 A | 2/2013 | | |
| JP | 2013156585 | * | 8/2013 | ............ H01L 31/00 |
| JP | 2013156585 A | 8/2013 | | |
| JP | 2013157567 A | 8/2013 | | |
| RU | 2012132819 A | 2/2014 | | |
| TW | 201133831 A | 10/2011 | | |
| WO | 2005/086302 A1 | 9/2005 | | |
| WO | 2007/029661 A1 | 3/2007 | | |
| WO | 2011/083674 A1 | 7/2011 | | |
| WO | Wo2011083674 | * | 7/2011 | ............ H01L 31/04 |
| WO | 2012/141141 A1 | 10/2012 | | |

OTHER PUBLICATIONS

Mihi A et al: "Full spectrum enhancement of the light harvesting efficiency of dye sensitized solar cells by including colloidal photonic crystal multilayers", Applied Physics Letters, American Institute of Physics, vol. 88, No. 19, May 9, 2006 (May 9, 2006), pp. 193110.1-193110.3.
Biswas et al.: "Enhancing Light-trapping and Efficiency of Solar Cells with Photonic Crystals", Proceedings of the Amorphous and Polycrystalline Thin-Film Silicon Science and Technology, 9.-13.04.2007, vol. 989, Apr. 9, 2007, pp. 35-40.
Whitesell et al.: "Silicon Solar Cell Light-Trapping Using Defect Mode Photonic Crystals", Proceedings of the SPIE, Physics, Simulation and Photonic Engineering of Photovoltaic Devices II, 3.-7.02.2013, vol. 8620, Feb. 3, 2013, pp. 86200D.1-86200D.7.
Jul. 25, 2016 Extended European Search Report issued in European Application No. 14784909.5.
Jul. 29, 2014 International Search Report issued in International Application No. PCT/JP2014/060731.
Jul. 29, 2014 International Preliminary Report on Patentability issued in International Application No. PCT/JP2014/060731.
A. Oskooi et al. Partially disordered photonic-crystal thin films for enhanced and robust photovoltaics, Applied Physics Letters, Apr. 30, 2012, vol. 100, No. 18, pp. 181110-1-181110-4.
Feb. 24, 2017 Office Action issued in Chinese Application No. 201480021934.1.
Dec. 5, 2019 Office Action issued in European Patent Application No. 14784909.5.
Sep. 1, 2020 Office Action issued in European Application No. 14 784 909.5.

* cited by examiner (a) FIRST PHOTONIC CRYSTAL STRUCTURE BODY 11A (b) SECOND PHOTONIC CRYSTAL STRUCTURE BODY 11B (c) PHOTONIC CRYSTAL 10

Fig. 4A-1 (a) EXAMPLES WITH DIFFERENT CYCLE LENGTH    Fig. 4A-2
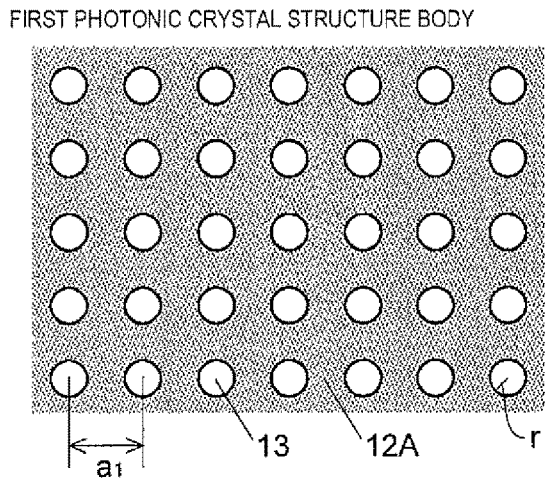
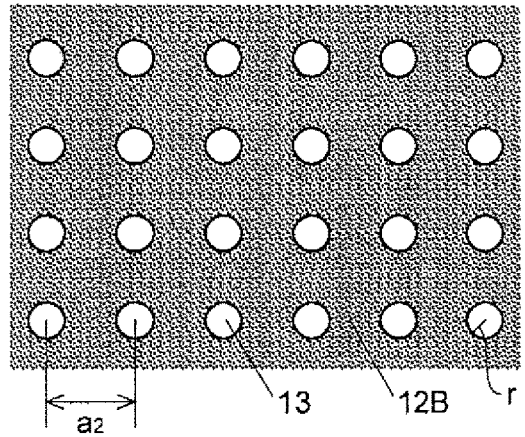
Fig. 4B-1 (b) EXAMPLES WITH DIFFERENT RADIUS    Fig. 4B-2
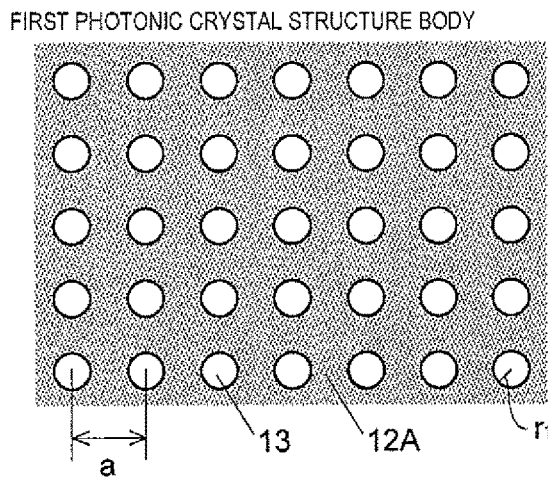
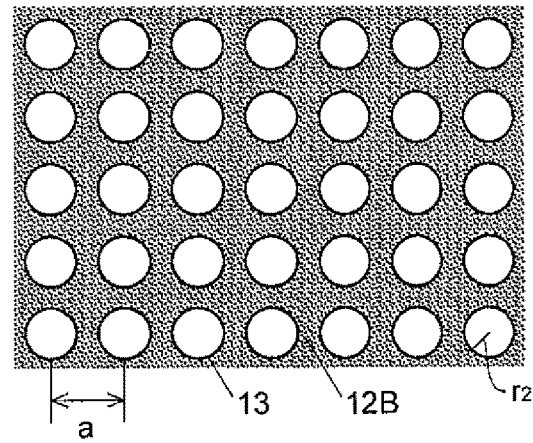
Fig. 5
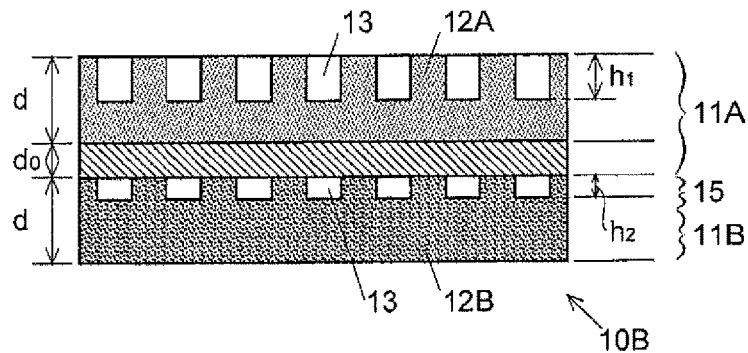

Fig. 9A  (a) PHOTONIC CRYSTAL STRUCTURE FORMATION BODY
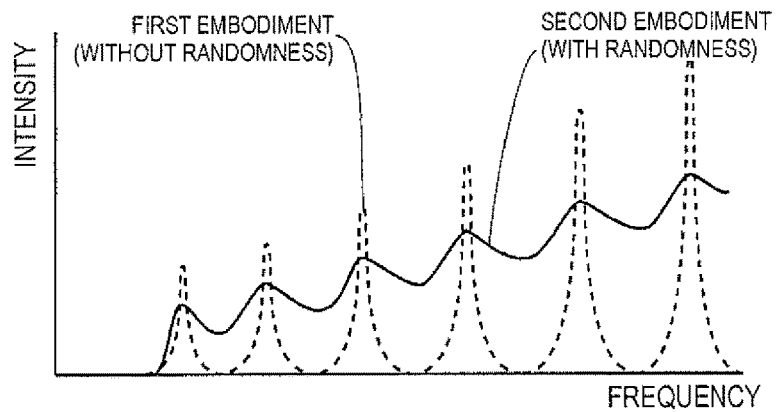
Fig. 9B  (b) PHOTONIC CRYSTAL
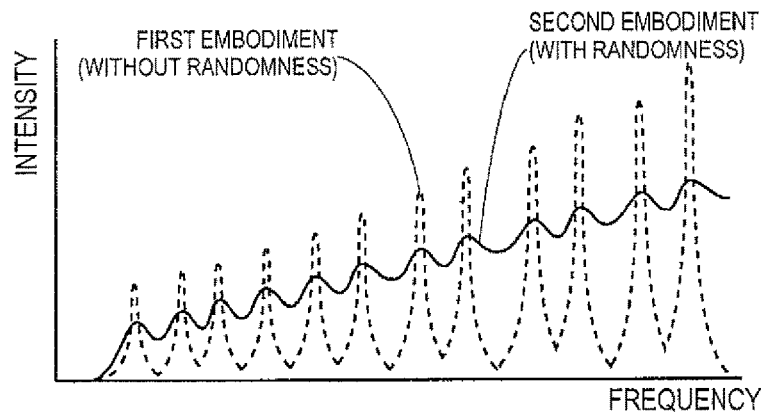
Fig. 10
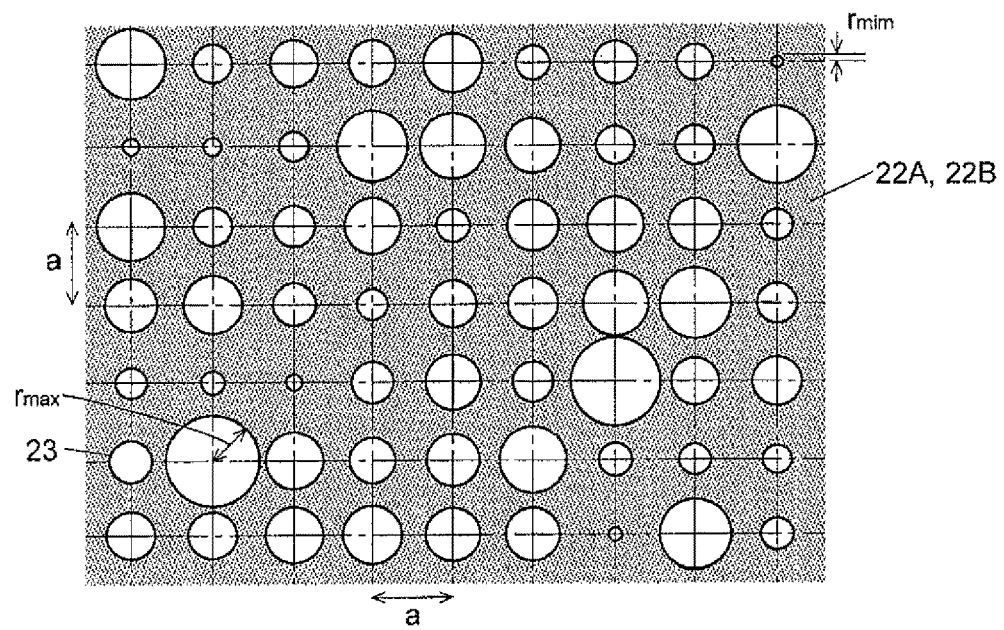

Fig. 11
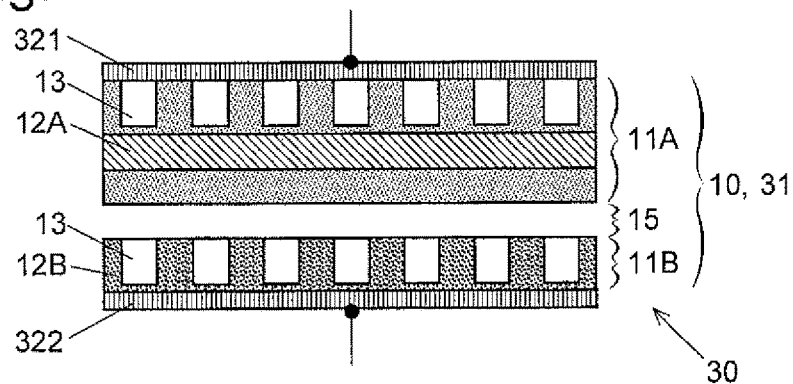
Fig. 12A
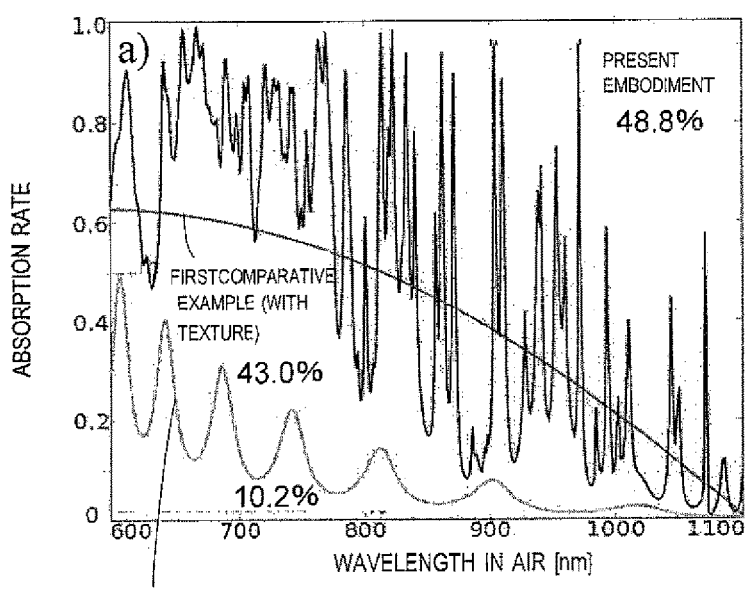
Fig. 12B
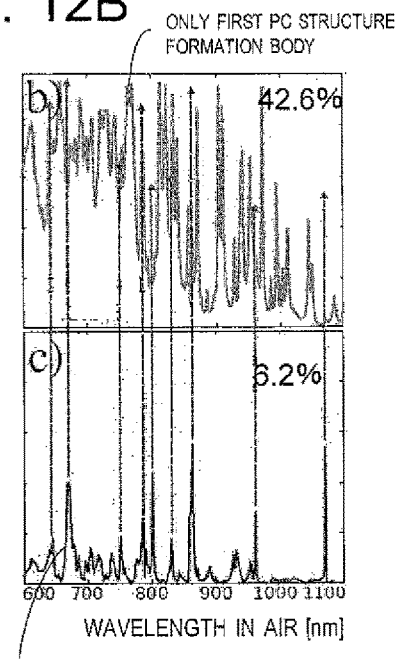
Fig. 12C

PHOTONIC CRYSTAL AND OPTICAL FUNCTIONAL DEVICE INCLUDING THE SAME

TECHNICAL FIELD

The present invention relates to a photonic crystal that can be used for an optical functional device such as a photoelectric conversion element and a diffraction element and to an optical functional device including the photonic crystal.

BACKGROUND ART

A solar cell that is a type of photoelectric conversion element includes a photoelectric conversion layer made of a semiconductor, for converting the energy of incident light (electromagnetic waves) into current. The incident light is absorbed by the photoelectric conversion layer, and electrons in the semiconductor of the photoelectric conversion layer are excited by the energy from a valence band to a conduction band. In this way, the incident light is converted into current. Here, if the incident light passes through the photoelectric conversion layer without being absorbed by this layer, the photoelectric conversion efficiency decreases. Hence, for the solar cell, it is important to have a higher absorption rate of the incident light in the photoelectric conversion layer. One way of achieving a higher absorption rate may be to increase the thickness of the photoelectric conversion layer. In this case, however, the amount of use of semiconductor material increases, and hence costs may rise or that the extraction efficiency of electrons may decrease.

Patent Literature 1 describes a solar cell including a photonic crystal in order to have a higher absorption rate of incident light. The photonic crystal generally refers to a structure having cyclic refractive index distribution. In the solar cell described in Patent Literature 1, holes are cyclically arranged in a photoelectric conversion layer, whereby such refractive index distribution is formed. According to such a configuration, among rays of light incident on the photoelectric conversion layer, light having a particular frequency corresponding to the cycle of the refractive index distribution forms standing waves to form a resonant state, and hence the light more easily stays in the photoelectric conversion layer. Hence, at the particular frequency (resonant frequency), the absorption rate of the incident light becomes higher than that in the case where the photonic crystal does not exist. Here, even in the case of a single structure, the photonic crystal normally has a plurality of cycles, rather than only a single cycle, and hence standing waves are formed at a plurality of frequencies. For example, in a photonic crystal having refractive index distribution in a square lattice pattern, standing waves are formed at: a frequency equivalent to a wavelength corresponding to a cycle length a of the square lattice; a frequency equivalent to a wavelength corresponding to $(2^{1/2}/2)$a that is half the length of the diagonal of a square as a unit lattice; and frequencies equivalent to wavelengths of integral multiples of these wavelengths. Accordingly, appropriately setting the cyclic structure of the refractive index distribution may help to achieve a higher light absorption rate at a plurality of resonant frequencies over the entire frequency range in which photoelectric conversion is possible in the photoelectric conversion layer.

CITATION LIST

Patent Literature

[Patent Literature 1] International Publication No. WO 2011/083674 A

[Patent Literature 2] International Publication No. WO 2005/086302 A

[Patent Literature 3] International Publication No. WO 2007/029661 A

[Patent Literature 4] JP 2001-074955 A

SUMMARY OF INVENTION

Technical Problem

As described above, in the solar cell including the photonic crystal, although the light absorption rate can be made higher at a plurality of resonant frequencies, resonating portions of frequencies are still insufficient in terms of the entire frequency range in which photoelectric conversion is possible, and hence the incident light cannot be considered to be sufficiently utilized. Accordingly, if the light can be resonated at more resonant frequencies within the frequency range in which photoelectric conversion is possible, the light absorption rate can be expected to be made further higher.

It is an object of the present invention to provide a photonic crystal capable of resonating light at more resonant frequencies within a particular frequency range and an optical functional device including the photonic crystal.

Solution to Problem

A photonic crystal according to the present invention for solving the above-mentioned problem is a photonic crystal that resonates with light having a plurality of frequencies within a predetermined frequency range, including:

a plurality of photonic crystal structure formation bodies each including a plate-like member in which cyclic refractive index distribution is formed, the photonic crystal structure formation bodies being provided so as to be spaced apart from each other in a thickness direction of the plate-like member, wherein the respective refractive index distributions of the plurality of photonic crystal structure formation bodies are set such that: at least one of the plurality of photonic crystal structure formation bodies resonates with light having at least two frequencies within the frequency range; and the two frequencies are different from resonant frequencies of at least one of the other photonic crystal structure formation bodies.

In the photonic crystal according to the present invention, at least one (which is defined as the "first formation body") of the plurality of provided photonic crystal structure formation bodies (the term "photonic crystal structure formation body" means a body in which a photonic structure is formed) resonates with light having at least two frequencies within the frequency range, and the two frequencies are different from the resonant frequencies of at least one (which is defined as the "second formation body") of the other photonic crystal structure formation bodies. Because the resonant frequencies of the first formation body and the second formation body are different from each other in this way, focusing on the two formation bodies, light resonance occurs at more resonant frequencies than that in the case where the first formation body or the second formation body exists alone. Accordingly, the photonic crystal according to the present invention can resonate light at more resonant frequencies within the frequency range.

If adjacent two photonic crystal structure formation bodies are in contact with each other, a light interaction occurs between the two photonic crystal structure formation bodies, and may prevent formation of standing waves. For this reason, in the present invention, the photonic crystal structure formation bodies are provided so as to be spaced apart from each other in the thickness direction of the plate-like member.

The resonant frequencies of each photonic crystal structure formation body can be set by, for example, adjusting the cycle length of the cyclic refractive index distribution and the average refractive index of the photonic crystal structure formation body. Those skilled in the art can make such resonant frequency setting based on, for example, the disclosures of Patent Literatures 2 and 3.

The cyclic refractive index distribution of each photonic crystal structure formation body may be two-dimensionally formed, and may be three-dimensionally formed. In terms of ease of manufacture, it is desirable to use a two-dimensional photonic crystal structure formation body formed by respectively arranging modified refractive index regions, each of which has a refractive index different from that of the plate-like member, at lattice points of a two-dimensional lattice parallel to the plate-like member. Each modified refractive index region may be a member made of a material having a refractive index different from that of the plate-like member, and may be formed by making a hole in the plate-like member. The latter can be more easily formed.

The cyclic refractive index distribution of each photonic crystal structure formation body may be formed by arranging modified refractive index regions, each of which has a refractive index different from that of the plate-like member, such that each modified refractive index region is randomly (that is, with a random size and in a random direction) shifted by an amount of shift (distance) $\Delta p$ equal to or less than a maximum amount of shift $\Delta p_{max}$ ($\neq 0$), in parallel to the plate-like member from each lattice point of a two-dimensional lattice parallel to the member. In this way, each lattice point of the cyclic two-dimensional lattice is defined as a reference, and randomness of the amount of shift $\Delta p$ from the reference is introduced. As a result, in the photonic crystal structure formation body, the intensity of light having each resonant frequency decreases, whereas the intensity of light having frequencies around the resonant frequency increases. That is, in a graph whose horizontal axis is the frequency and whose vertical axis is the intensity of light, the width of a peak centering on the resonant frequency is made larger by the introduction of such randomness. Accordingly, the intensity of light inside the photonic crystal structure formation body over the entire frequency range can be made higher.

Alternatively, the cyclic refractive index distribution of each photonic crystal structure formation body may be fort led by respectively arranging modified refractive index regions, each of which has a refractive index different from that of the plate-like member, at lattice points of a two-dimensional lattice parallel to the plate-like member such that a planar shape of each modified refractive index region has a random size between a minimum value and a maximum value. Also in this case, randomness is introduced to the refractive index distribution, whereby the intensity of light inside the photonic crystal structure formation body over the entire frequency range can be made higher.

The photonic crystal according to the present invention can be used for an optical functional device capable of efficiently utilizing light within the frequency range.

An example of the optical functional device is a photoelectric conversion apparatus including a photoelectric conversion layer that is made of a semiconductor and is provided between a pair of electrodes, the photoelectric conversion layer being for converting light within a predetermined frequency range into electric power, wherein the photonic crystal according to the present invention is formed in the photoelectric conversion layer. This photoelectric conversion apparatus can be used as, typically, a solar cell or an optical sensor.

In this photoelectric conversion apparatus, when light within the frequency range is made incident on the photoelectric conversion layer, standing waves having resonant frequencies of each photonic crystal structure formation body of the photonic crystal according to the present invention are formed in the photonic crystal structure formation body. Light for which such standing waves are formed more easily stays in the photoelectric conversion layer, and is thus more easily absorbed by the photoelectric conversion layer to be converted into current. As a result, the photoelectric conversion efficiency for light having the resonant frequencies becomes higher. In the photonic crystal according to the present invention, a large number of such resonant frequencies exist, and hence the photoelectric conversion efficiency can be made further higher.

The photoelectric conversion apparatus according to the present invention may have a configuration in which: each photonic crystal structure formation body is formed as a structure in which a p-type semiconductor and an n-type semiconductor (or a p-type semiconductor, an intrinsic semiconductor, and an n-type semiconductor) are joined to each other; and adjacent two photonic crystal structure formation bodies are spaced apart from each other by a conductor layer. In this case, each photonic crystal structure formation body functions as one photoelectric conversion unit, and such photoelectric conversion units are connected in series with the intermediation of conductor layers.

Alternatively, the photoelectric conversion apparatus according to the present invention may have a configuration in which: each photonic crystal structure formation body is formed as a structure in which a p-type semiconductor and an n-type semiconductor (or a p-type semiconductor, an intrinsic semiconductor, and an n-type semiconductor) are joined to each other; and adjacent two photonic crystal structure formation bodies are spaced apart from each other by a spacer layer formed by laminating a first conductor layer, an insulator layer, and a second conductor layer in a stated order. Also in this case, each photonic crystal structure for nation body functions as one independent photoelectric conversion unit. The first conductor layer and the second conductor layer can be used as electrodes for the photoelectric conversion units configured by the photonic crystal structure formation bodies respectively adjacent to these layers, and the insulator layer has a function of electrically insulating the photoelectric conversion units from each other.

The semiconductor in the photoelectric conversion layer is formed by, typically, joining a p-type semiconductor and an n-type semiconductor to each other. In the case of using such a p-n junction semiconductor, the number of photonic crystal structure formation bodies may be set to two, one of the photonic crystal structure formation bodies may be made of a p-type semiconductor, and the other of the photonic crystal structure formation bodies may be made of an n-type semiconductor. Alternatively, an intrinsic semiconductor may be interposed between a p-type semiconductor and an n-type semiconductor.

Another example of the optical functional device is a diffraction element for scattering light within a predetermined frequency range, including the photonic crystal according to the present invention. Conditions for occurrence of light resonance in the photonic crystal, that is, conditions for formation of standing waves of light are equal to conditions for occurrence of Bragg reflection. Because the Bragg reflection is one of light diffraction phenomena, a photonic crystal that satisfies the conditions for such Bragg reflection can also be used as a diffraction element.

In the diffraction element according to the present invention, standing waves of light having frequencies corresponding to each resonant frequency are formed in each photonic crystal structure formation body, and these rays of light are diffracted by the cyclic refractive index distribution to be extracted to the outside. Such a diffraction element can be used suitably for, for example, a light guide plate in order to scatter light, the light guide plate guiding light to a back surface from a light source provided lateral to a liquid crystal display and emitting the light from the back surface.

Advantageous Effects of Invention

According to the present invention, a photonic crystal capable of resonating light at more resonant frequencies within a particular frequency range can be obtained. An optical functional device, such as a photoelectric conversion apparatus and a diffraction element, capable of efficiently utilizing light within the frequency range can also be obtained by using the photonic crystal.

BRIEF DESCRIPTION OF DRAWINGS

FIG. 4A-1 and FIG. 4A-2 are top views showing a first modified example of the first embodiments, and FIG. 4B-1 and FIG. 4B-2 are top views showing a second modified example.

FIG. 5 is a longitudinal sectional view showing a third modified example of the first embodiment.

FIG. 9A and FIG. 9B are conceptual views in which resonant frequencies of the photonic crystal of the first embodiment and a photonic crystal of the second embodiment are compared with each other.

FIG. 10 is a top view showing a modified example of the second embodiment.

FIG. 11 is a longitudinal sectional view showing a first embodiment of a photoelectric conversion element according to the present invention.

FIG. 12A, FIG. 12B, and FIG. 12C are graphs showing results of calculating a light absorption rate for each wavelength, in photoelectric conversion elements of the first embodiment and comparative examples.

DESCRIPTION OF EMBODIMENTS

Embodiments of a photonic crystal and an optical functional device according to the present invention are described with reference to FIG. 1A to FIG. 17.

Figure 1A:
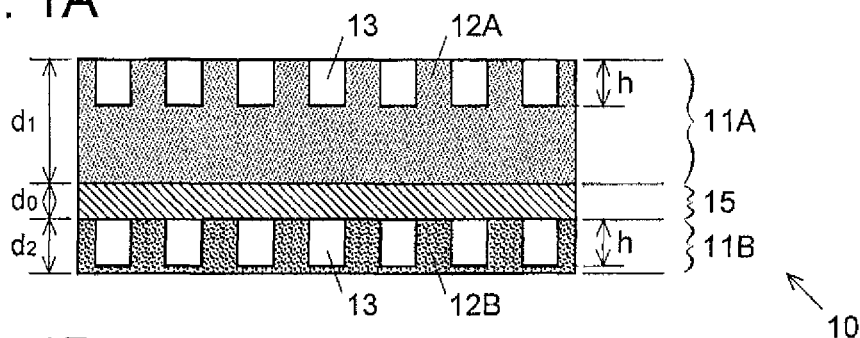
FIG. 1A is a longitudinal sectional view showing a configuration of a first embodiment of a photonic crystal according to the present invention.
Figure 1B:
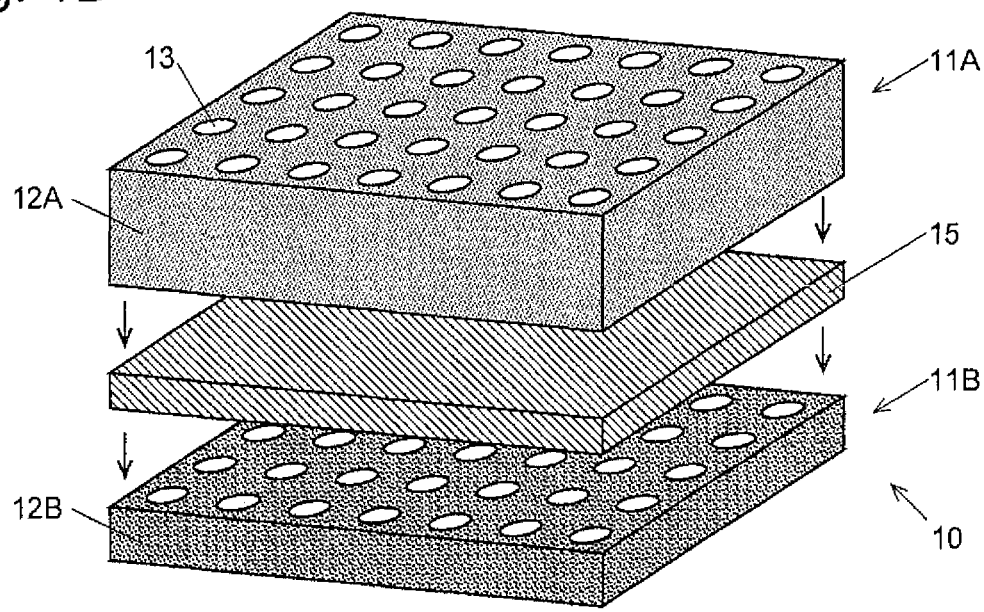
FIG. 1B is a perspective view showing configurations of a first photonic crystal structure formation body, a second photonic crystal structure formation body, and a spacer layer included in the photonic crystal.

EMBODIMENTS (1) First Embodiment of Photonic Crystal According to Present Invention As shown in FIG. 1A and FIG. 1B, a photonic crystal 10 of the first embodiment has a configuration in which three layers of a first photonic crystal structure formation body 11A, a spacer layer 15, and a second photonic crystal structure formation body 11B are laminated in the stated order. For the purpose of illustrating configurations of these three layers, adjacent layers are separately depicted in FIG. 1B, but are in contact with each other as shown in FIG. 1A, in actuality. Hereinafter, the "photonic crystal structure formation body" is abbreviated as the "PC structure formation body."

The first PC structure formation body 11A is formed by cyclically arranging a large number of columnar holes 13 in a square lattice pattern in a first plate-like member 12A made of a p-type silicon semiconductor. The height direction of the column of each hole 13 is coincident with the thickness direction of the first plate-like member 12A, and a height h of the column is smaller than a thickness $d_1$ of the first plate-like member 12A. The second PC structure formation body 11B is formed by cyclically arranging a large number of columnar holes 13 in a square lattice pattern in a second plate-like member 12B made of an n-type silicon semiconductor, similarly to the first PC structure formation body 11A. When the first PC structure formation body 11A and the second PC structure formation body 11B are compared with each other in the size of each constituent element, the two bodies are the same in a radius r and the height h of the column of the hole 13 and a cycle length a of the square lattice, and are different in that a thickness $d_2$ of the second plate-like member 12B is smaller than the thickness $d_1$ of the first plate-like member 12A. Accordingly, in the second PC structure formation body 11B, the rate of the volume occupied by the holes in the plate-like member is higher and the average refractive index is thus lower than in the first PC structure formation body 11A.

In the present embodiment, electrically conductive indium tin oxide (ITO) transparent to visible light was used as the material of the spacer layer 15, and the ITO can be used in the case where a target frequency domain (the above-mentioned "predetermined frequency range") is a visible light region. Various materials can be used as the material of the spacer layer 15 in accordance with the intended use of the photonic crystal and the like. For example, in the case where the photonic crystal of the present embodiment is used for a p-i-n solar cell in which a p-type semiconductor, an intrinsic semiconductor, and an n-type semiconductor are joined in the stated order, an intrinsic semiconductor of another material having a lower refractive index than that of the plate-like member may be used as the material of the spacer layer 15.

Figure 2:
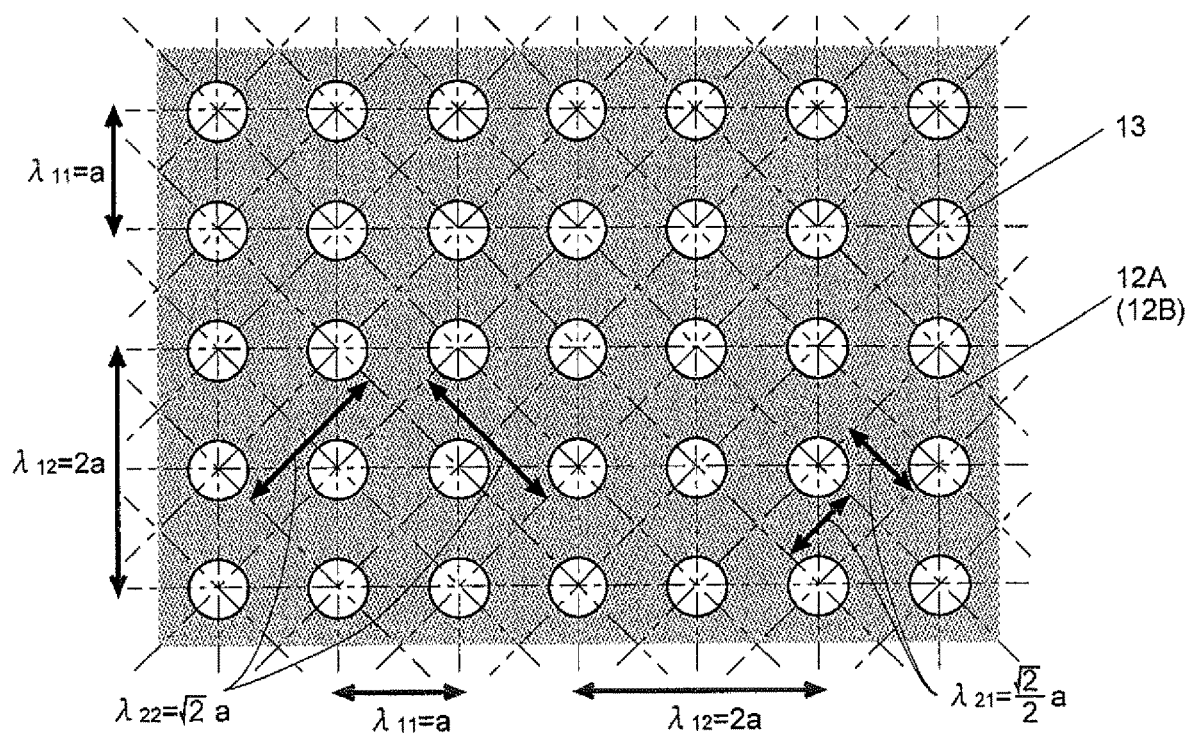
FIG. 2 is a conceptual view showing examples of standing waves generated in a photonic crystal structure formation body in the first embodiment.

In the photonic crystal of the first embodiment, when a mixture of rays of light having various frequencies within a target frequency domain (for example, a visible light region or a region in which photoelectric conversion of a solar cell can be efficiently performed) is introduced from the outside, standing waves are formed at a plurality of frequencies (wavelengths) corresponding to the cycle length of the arranged holes in each of the first PC structure formation body 11A and the second PC structure formation body 11B. For example, as shown in FIG. 2, the plurality of standing waves thus formed include: a standing wave having a wave front parallel to the lattice and having a wavelength $\lambda_{11}=a$ (that is, equal to the cycle length a of the holes); a standing wave having a wave front inclined by 45° to the lattice and having a wavelength $\lambda_{21}=(2^{1/2}/2)a$; and standing waves having wavelengths of integral multiples of these wavelengths.

In the present embodiment, both the first PC structure formation body 11A and the second PC structure formation body 11B are square lattices having the same lattice constant a, and hence the wavelengths of the standing waves inside the two bodies are the same. However, even if the wavelengths inside the two bodies are the same, the first PC structure formation body 11A and the second PC structure formation body 11B are different in the average refractive index, and are thus different in the frequency of each standing wave. Accordingly, the wavelengths of light before introduction into the photonic crystal 10 and after extraction from the photonic crystal 10 are also different between the standing waves in the first PC structure formation body 11A and the standing waves in the second PC structure formation body 11B.

Figure 3A:
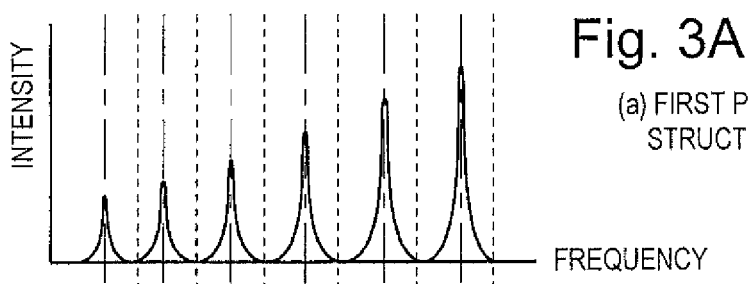
FIG. 3A is a conceptual view showing resonant frequencies of a first photonic crystal structure formation body in the first embodiment.
Figure 3B:
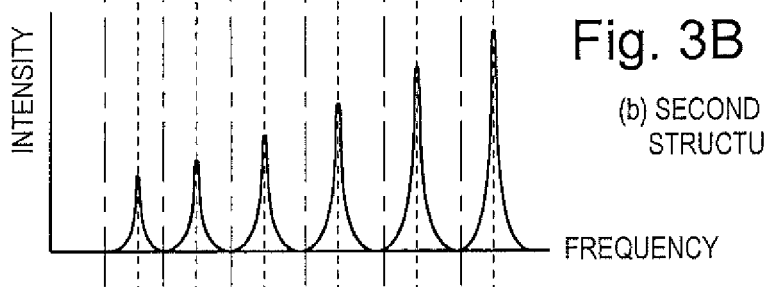
FIG. 3B is a conceptual view showing resonant frequencies of a second photonic crystal structure formation body in the first embodiment.
Figure 3C:
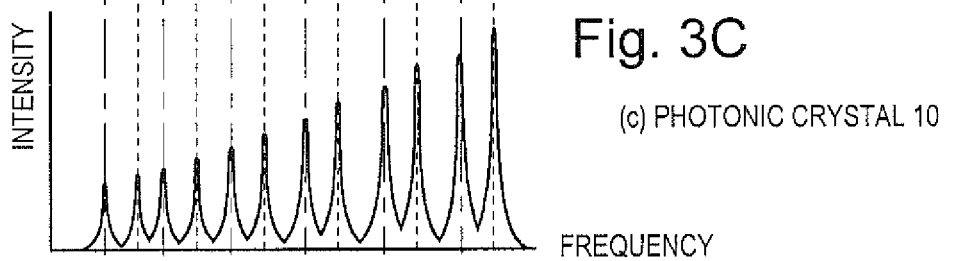
FIG. 3C is a conceptual view showing resonant frequencies of a photonic crystal in the first embodiment.

Accordingly, due to such differences of the standing wave frequencies (resonant frequencies) inside the first PC structure formation body 11A and the second PC structure formation body 11B and the standing wave wavelengths outside the photonic crystal, the photonic crystal 10 can make the number of resonant frequencies larger than that in the case where an individual PC structure formation body exists alone. In this regard, description is given with reference to FIG. 3A, FIG. 3B, and FIG. 3C. Each of FIG. 3A to FIG. 3C is a graph whose horizontal axis is the frequency and whose vertical axis is the intensity of light. FIG. 3A shows a change of the intensity of light depending on the frequency, in the first PC structure formation body 11A, FIG. 3B shows the change in the second PC structure formation body 11B, and FIG. 3C shows the change in the photonic crystal 10 including the two bodies. A plurality of peaks respectively centering on the resonant frequencies appear in all of these graphs. When the first PC structure formation body 11A in FIG. 3A and the second PC structure formation body 11B in FIG. 3B are compared with each other, the resonant frequencies are different. Hence, both the resonant frequencies of the first PC structure formation body 11A and the resonant frequencies of the second PC structure formation body 11B form the resonant frequencies of the photonic crystal 10 in FIG. 3C.

Light of standing waves confined in each PC structure formation body leaks in the direction perpendicular to the PC structure formation body, by a distance of about the wavelength of the light. Hence, in the case where the distance between the first PC structure formation body 11A and the second PC structure formation body 11B is shorter than the distance of the wavelength of the light, a light interaction occurs between the two PC structure formation bodies. If the first PC structure formation body 11A and the second PC structure formation body 11B are in contact with each other, such a light interaction may prevent formation of standing waves. If the two bodies are spaced a little apart from each other, even if light having a resonant frequency of one of the PC structure formation bodies is introduced into the other of the PC structure formation bodies, light resonance concerning the one of the PC structure formation bodies can also be generated in the other of the PC structure formation bodies. In order to generate such a light interaction in at least part of a target frequency domain, it is desirable that the distance between the first PC structure formation body 11A and the second PC structure formation body 11B, that is, the thickness of the spacer layer 15 be set to be shorter than the wavelength in the spacer layer 15, of light having the lowest frequency (largest wavelength) within the target frequency domain. Moreover, in order to generate such an interaction in the entire target frequency domain, it is more desirable that the distance be set to be shorter than the wavelength in the spacer layer 15, of light having the highest frequency (smallest wavelength) within the target frequency domain.

(2) Modified Examples of Photonic Crystal of First Embodiment

Figure 1C:
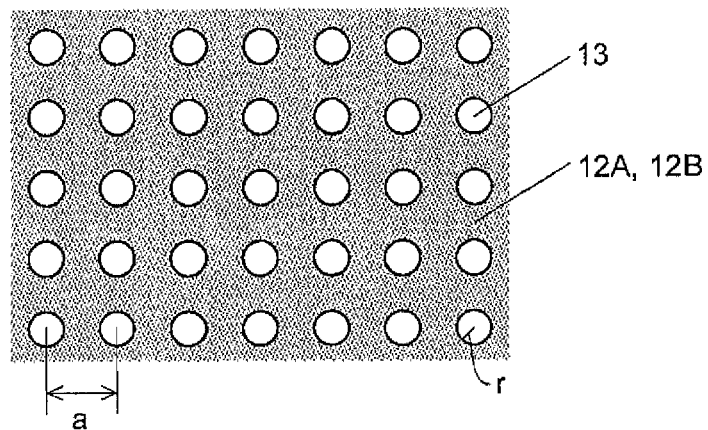
FIG. 1C is a top view showing a configuration of each of the first photonic crystal structure formation body and the second photonic crystal structure formation body.

In the first embodiment, the two PC structure formation bodies have the same cycle length a. Alternatively, as shown in FIG. 4A-1 and FIG. 4A-2, the cycle lengths of the two bodies may be set to different values $a_1$ and $a_2$ (a first modified example). According to this modified example, the resonant wavelengths inside the two PC structure formation bodies have different values, and hence the resonant frequencies of the two PC structure formation bodies can be made different values even if the two bodies have the same thickness d.

Moreover, in the first embodiment, the two PC structure formation bodies have the same radius r of each hole 13. Alternatively, as shown in FIG. 4B-1 and FIG. 4B-2, the radii of the holes of the two bodies may be set to different values $r_1$ and $r_2$ (a second modified example, a photonic crystal 10B). According to this modified example, similarly to the first embodiment, the average refractive indexes of the two PC structure formation bodies can be made different values, and hence the resonant frequencies of the two PC structure formation bodies can be made different values even if the two bodies have the same thickness d and the same cycle length a. Alternatively, as shown in FIG. 5, the heights of the holes 13 of the two PC structure formation bodies may be set to different values $h_1$ and $h_2$ (a third modified example).

Figure 6:
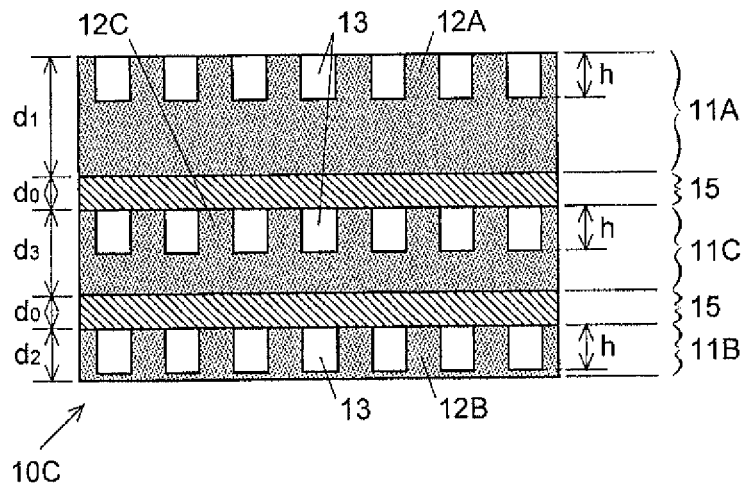
FIG. 6 is a longitudinal sectional view showing a fourth modified example of the first embodiment.

In the first embodiment, description is given of the example in which two PC structure formation bodies are provided to one photonic crystal. Alternatively, as shown in FIG. 6, three or more PC structure formation bodies may be provided (a fourth modified example, a photonic crystal 10C). In the example shown in FIG. 6, a third PC structure formation body 11C is provided between the two PC structure formation bodies in the first embodiment. A thickness $d_3$ of the third PC structure formation body 11C has a value between $d_1$ and $d_2$, and the holes 13 are formed in a square lattice pattern in the third PC structure formation body 11C with the same shape, the same size, and the same cycle length a as those formed in the other two PC structure formation bodies. According to this modified example, standing waves whose wavelengths inside the third PC structure formation body 11C are the same as those of the other PC structure formation bodies and whose frequencies and wavelengths outside the photonic crystal are different therefrom are formed in the third PC structure formation body 11C. Accordingly, the photonic crystal of the fourth modified example can make the number of resonant frequencies further larger than that of the first embodiment.

The shape of each hole 13 is not limited to a columnar shape, and various shapes (for example, a prismatic shape such as a triangular prism and a quadrangular prism (cuboid), a conical shape, a pyramidal shape such as a triangular pyramid and a quadrangular pyramid, a partial spherical shape, and a partial oval spherical shape) can be adopted. The arrangement cycle of the holes 13 is not limited to the square lattice pattern, and can be a triangular lattice pattern, a rectangular lattice pattern, an orthorhombic lattice pattern, and other lattice patterns. The materials of the first plate-like member 12A and the second plate-like member 12B are not limited to the above-mentioned ones, and any material can be adopted as long as the material enables light within a target frequency domain to propagate such that standing waves of the light within the frequency domain are formed in each PC structure formation body. Further, in addition to such a two-dimensional photonic crystal as described above formed by cyclically arranging modified refractive index regions in each plate-like member, photonic crystals in various forms, for example, a three-dimensional photonic crystal described in Patent Literature 4 can also be adopted.

Figure 7A:
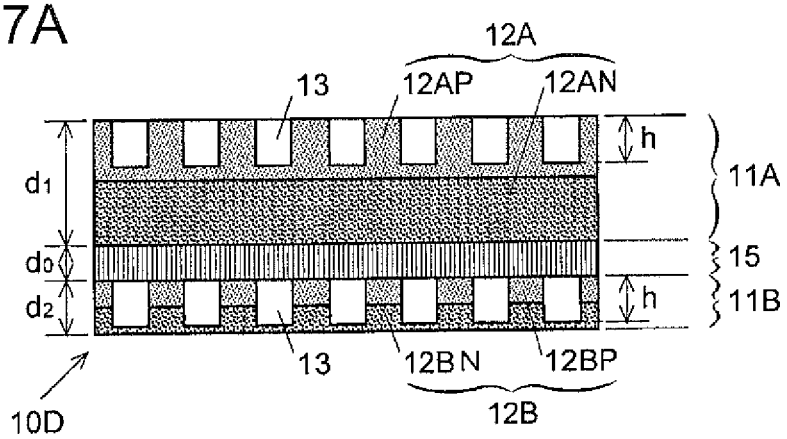
FIG. 7A and FIG. 7B are longitudinal sectional views showing a fifth modified example of the first embodiment.
Figure 7B:
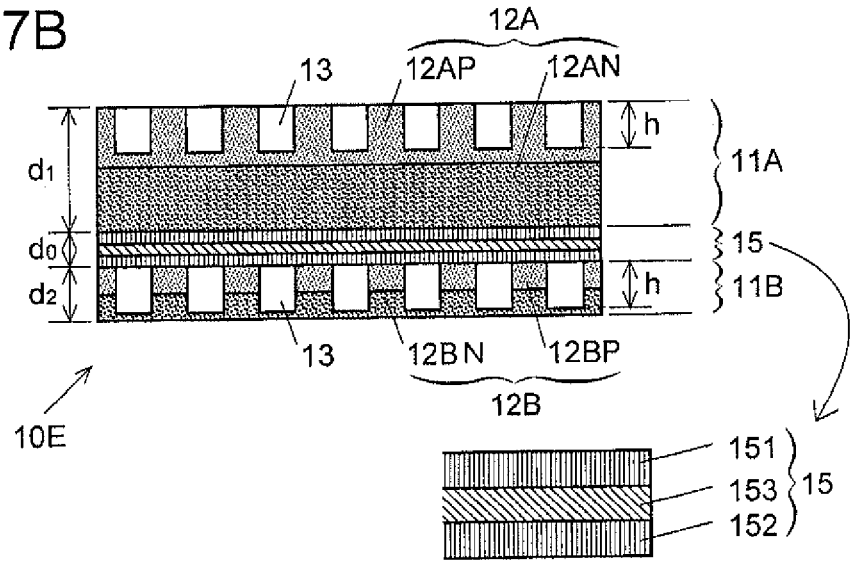

Alternatively, as shown in FIG. 7A and FIG. 7B, a member obtained by joining a p-type semiconductor layer 12AP and an n-type semiconductor layer 12AN may be used as the first plate-like member 12A, and a member obtained by joining a p-type semiconductor layer 12BP and an n-type semiconductor layer 12BN may be used as the second plate-like member 12B (a fifth modified example). In this case, a layer made of a conductor may be used for the spacer layer 15 (FIG. 7A, a photonic crystal 10D), and a three-layer structure in which a first conductor layer 151, an insulator layer 153, and a second conductor layer 152 are laminated in the stated order may be used for the spacer layer 15 (FIG. 7B, a photonic crystal 10E). Such photonic crystals can be used suitably for photoelectric conversion apparatuses to be described later.

(3) Photonic Crystal of Second Embodiment

Figure 8A:
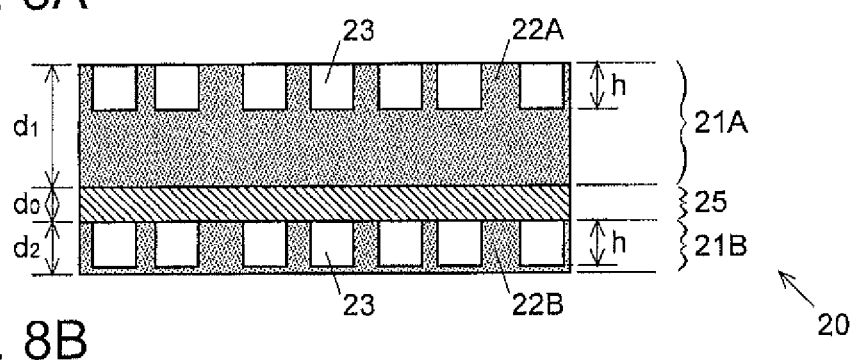
FIG. 8A is a longitudinal sectional view showing a configuration of a second embodiment of the photonic crystal according to the present invention.
Figure 8B:
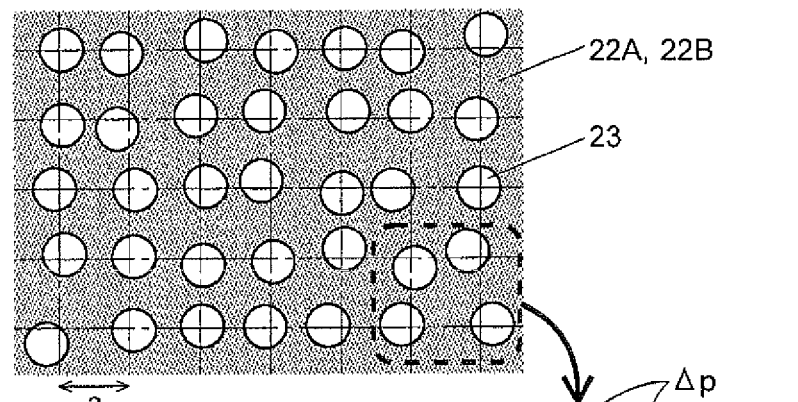
FIG. 8B is a top view showing a configuration of each of a first photonic crystal structure formation body and a second photonic crystal structure formation body.
Figure 8C:
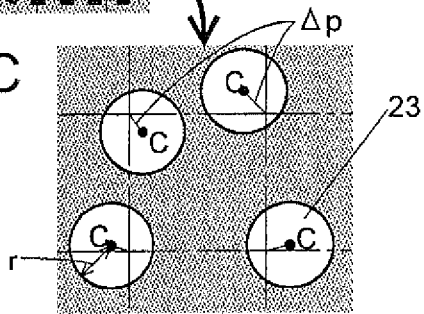
FIG. 8C is a partial enlarged view of FIG. 8B.

A photonic crystal 20 of the second embodiment is the same as the photonic crystal 10 of the first embodiment in that, as shown in FIG. 8A, the photonic crystal 20 has a configuration in which three layers of a first PC structure formation body 21A, a spacer layer 25, and a second PC structure formation body 21B are laminated in the stated order. Moreover, the second embodiment is the same as the first embodiment in the thicknesses $d_1$ and $d_2$ (of the plate-like members) of the first PC structure formation body 21A and the second PC structure formation body 21B.

A large number of holes 23 each having the radius r and the height h are provided in the first PC structure formation body 21A and the second PC structure formation body 21B. Each hole 23 is arranged such that the center of the circle of its column is shifted by Δp from each lattice point of the square lattice (as indicated by an alternate long and short dash line in FIG. 8B). The amount of shift Δp is distributed within a range of 0 to a maximum amount of shift $\Delta p_{max}$, and there is no rule for the distribution. Moreover, the direction in which each hole 23 is shifted from each lattice point is not uniform, and there is no rule for the difference among the holes 23. That is, each hole 23 is arranged so as to be randomly shifted by the amount of shift Δp equal to or less than the maximum amount of shift $\Delta p_{max}$ ($\neq 0$) from each lattice point of the square lattice.

How the positions of the holes 23 are shifted when the first PC structure formation body 21A and the second PC structure formation body 21B are compared with each other may be the same between the two bodies, or may be different between the two bodies.

In the photonic crystal 20 of the second embodiment, because each hole 23 is arranged so as to be randomly shifted from each lattice point of the square lattice, refractive index distribution to which randomness is introduced while a cyclic pattern is held to some extent is formed in a two-dimensional photonic crystal. Accordingly, with reference to a graph whose horizontal axis is the frequency and whose vertical axis is the intensity of light, the first PC structure formation body 21A and the second PC structure formation body 21B have peaks at a plurality of wavelengths corresponding to the basic cyclic pattern of the lattice points. Due to the randomness, each peak has a smaller peak top height but has a larger width than those in the first embodiment, and hence the intensity is higher at each frequency that is away from the peak top to some extent (FIG. 9A). In the photonic crystal 20, the number of resonant frequencies is larger than that in the case where an individual PC structure formation body is used, similarly to the photonic crystal of the first embodiment, and each peak has a smaller peak top height but has a larger width similarly to the PC structure formation bodies in the present embodiment. Because each peak width is larger in this way, the intensity of light inside the photonic crystal can be made higher than that in the first embodiment, in terms of the overall target frequency domain. Moreover, because each hole 23 is arranged so as to be randomly shifted from each lattice point, the radiation-direction dependence of a resonant mode is smaller, so that such a property that a change in absorption property with respect to a change in incident angle is smaller is obtained.

If the maximum amount of shift $\Delta p_{max}$ is made larger, adjacent holes may overlap with each other. If holes overlap with each other, a plurality of holes form one modified refractive index region, and hence the cyclic pattern of the square lattice is disturbed more than necessary. Moreover, at the point at which the profiles of the plurality of holes overlap with each other, the shape of the plate-like member of the PC structure formation body is pointed toward the hole, and such a shape is difficult to make, which is problematic. Hence, it is desirable to set the maximum amount of shift $\Delta p_{max}$ such that adjacent holes are separated from (do not overlap with) each other, in consideration of the shapes and the sizes of the holes (modified refractive index regions).

(4) Modified Example of Photonic Crystal of Second Embodiment

Instead of randomly shifting each hole 23 from each lattice point as in the photonic crystal 20 of the second embodiment, as shown in FIG. 10, each hole 23A may be arranged at each lattice point of the square lattice, and the size, for example, the radius of each hole 23A may be randomly set within a range of $r_{min}$ to $r_{max}$. According to this modified example, each peak on a graph whose horizontal axis is the frequency and whose vertical axis is the intensity of light has a smaller peak top height but has a larger width, similarly to the photonic crystal 20 of the second embodiment, and hence the intensity of light inside the photonic crystal can be made higher in terms of the overall target frequency domain. Although the size of the hole 23A is defined as the radius in this example, the size of the hole 23A may be defined as the area, the volume, or the like. Also in this case, it is desirable to set $r_{max}$ such that adjacent holes are separated from (do not overlap with) each other.

(5) First Embodiment of Photoelectric Conversion Apparatus According to Present Invention The first embodiment of the photoelectric conversion apparatus according to the present invention is described with reference to FIG. 11, FIG. 12A, FIG. 12B, and FIG. 12C.

As shown in FIG. 11, a photoelectric conversion apparatus 30 of the present embodiment is formed by sandwiching the photonic crystal 10 of the first embodiment between a plate-like transparent electrode 321 and a plate-like back-side electrode 322.

As described above, the first plate-like member 12A constituting the photonic crystal 10 is made of the p-type silicon semiconductor, and the second plate-like member 12B constituting the same is made of the n-type silicon semiconductor. Hence, the photonic crystal 10 functions as a photoelectric conversion layer 31 formed through p-n junction with the electrically conductive spacer layer 15 being sandwiched between the two members 12A and 12B. This photoelectric conversion layer can absorb light within such a range that the wavelength in air is about 600 to 1,100 nm and the frequency is $2.7 \times 10^{14}$ to $5.0 \times 10^{14}$ Hz, and can convert the absorbed light into current. The thickness $d_1$ of the first plate-like member 12A is set to 700 nm, and the thickness $d_2$ of the second plate-like member 12B is set to 300 nm. For both the first PC structure formation body 11A and the second PC structure formation body 11B, the height h of each hole 13 is 260 nm, the radius of each hole 13 is 200 nm, and the cycle length a of the square lattice is 700 nm. A thickness $d_0$ of the spacer layer 15 is 230 nm. The spacer layer 15 and the transparent electrode 321 are each made of ITO transparent to light within the above-mentioned frequency range, and the back-side electrode 322 is made of silver.

In the photoelectric conversion apparatus 30 of the first embodiment, when light having a frequency within the above-mentioned range is made incident on the photoelectric conversion layer 31 from the transparent electrode 321 side, standing waves of light having frequencies corresponding to a large number of resonant frequencies in the photonic crystal 10 as the photoelectric conversion layer 31 are formed in the photonic crystal 10. Consequently, light having the resonant frequencies more easily stays in the photoelectric conversion layer 31, and are more easily absorbed by the photoelectric conversion layer 31 to be converted into current. As a result, the photoelectric conversion efficiency becomes higher. Here, because the plurality of (two) PC structure formation bodies are provided to the photoelectric conversion apparatus 30 of the first embodiment, the number of resonant frequencies is larger than that in the case where only one similar PC structure formation body is provided, and therefore the photoelectric conversion efficiency can be made higher.

FIG. 12A shows a result of calculating the light absorption rate of the photoelectric conversion layer 31 when sunlight is made incident on the photoelectric conversion apparatus 30 of the first embodiment, by means of a graph whose horizontal axis is the light wavelength in air. FIG. 12A also shows, as comparative examples, respective graphs of the light absorption rates in: a solar cell having a light incident surface that is provided with irregularities called Lambertian texture instead of a photonic crystal (a first comparative example); and a solar cell that is not provided with any of a photonic crystal and Lambertian texture (a second comparative example). In the first embodiment and the first and second comparative examples, the semiconductor materials forming the photoelectric conversion layer and the amounts of the materials were set to be the same, whereby conditions concerning light absorption, other than the holes of the photonic crystal and whether or not the texture structure existed, were equalized. As is apparent from FIG. 12A, the integrated absorption rate obtained by integrating and then normalizing each graph of the absorption rate over the entire target wavelength band was 43.0% in the first comparative example and 10.2% in the second comparative example, whereas this rate was 48.8% in the first embodiment, which was a value higher than those in the two comparative examples.

Further, light absorbed by the photonic crystal 10 in the photoelectric conversion apparatus 30 of the first embodiment is divided into light absorbed by the first PC structure formation body 11A (FIG. 12B) and light absorbed by the second PC structure formation body 11B (FIG. 12C), and the respective absorption rates of these rays of light are shown in graphs. As is apparent from FIG. 12B and FIG. 12C, at a plurality of wavelengths indicated by vertical arrows in these graphs, light is hardly absorbed by the first PC structure formation body 11A, and is absorbed by the second PC structure formation body 11B with high efficiency. That is, in the first embodiment, the number of wavelengths (resonant wavelengths, resonant frequencies) with a high absorption rate can be made larger than that in the case where only one PC structure formation body (first PC structure formation body 11A) is provided, whereby the absorption rate of the entire photoelectric conversion layer 31 can also be made higher.

Figure 13A:
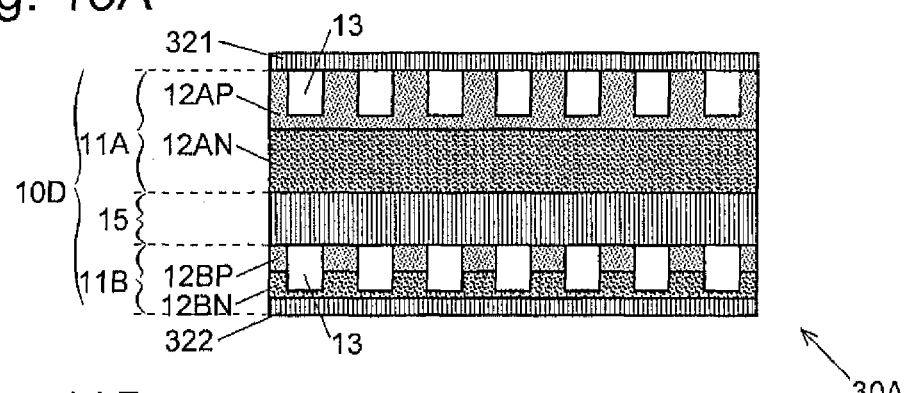
FIG. 13A and FIG. 13B are longitudinal sectional views respectively showing modified examples of the photoelectric conversion element of the first embodiment.
Figure 13B:
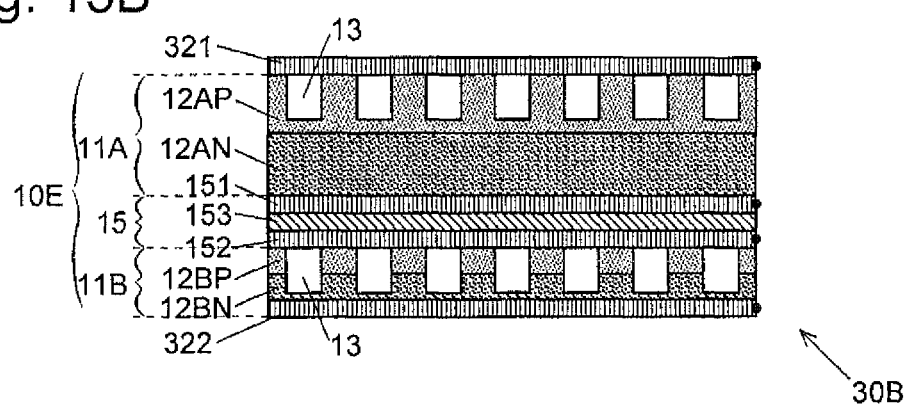

FIG. 13A and FIG. 13B respectively show, as modified examples of the photoelectric conversion apparatus of the first embodiment, a photoelectric conversion apparatus 30A including the photonic crystal 10D in the fifth modified example and a photoelectric conversion apparatus 30B including the photonic crystal 10E in the fifth modified example. In each of the photoelectric conversion apparatuses 30A and 30B, both the first PC structure formation body 11A and the second PC structure formation body 11B have the configuration in which the p-type semiconductor layer and the n-type semiconductor are laminated, as described above, and function as photoelectric conversion apparatuses independently of each other. In the photoelectric conversion apparatus 30A, the spacer layer 15 has a role in connecting the two independent photoelectric conversion apparatuses in series. Meanwhile, in the photoelectric conversion apparatus 30B, the first conductor layer 151 in the spacer layer 15 has a role as an electrode for injecting current into the first PC structure formation body 11A, and the second conductor layer 152 in the spacer layer 15 has a role as an electrode for injecting current into the second PC structure formation body 11B. The insulator layer 153 has a role in electrically insulating the two photoelectric conversion layers from each other.

(6) Second Embodiment of Photoelectric Conversion Apparatus According to Present Invention The second embodiment of the photoelectric conversion apparatus according to the present invention is described with reference to FIG. 14 to FIG. 16.

Figure 14:
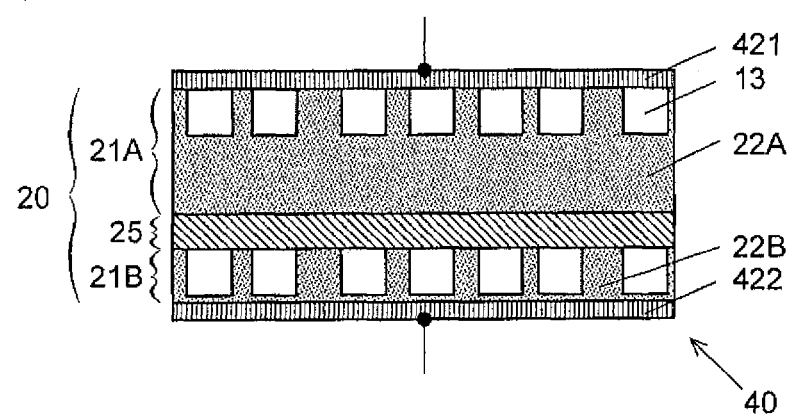
FIG. 14 is a longitudinal sectional view showing a solar cell that is a second embodiment of the photoelectric conversion element according to the present invention.

As shown in FIG. 14, a photoelectric conversion apparatus 40 of the second embodiment is formed by sandwiching the photonic crystal 20 of the second embodiment between a plate-like transparent electrode 421 and a plate-like backside electrode 422. The materials of the transparent electrode 421 and the back-side electrode 422 are the same as those used in the photoelectric conversion apparatus of the first embodiment.

In the present embodiment, the absorption rate for each wavelength and the integrated absorption rate were calculated for a plurality of values that are equal to or less than one and can be taken by the maximum amount of shift $\Delta p_{max}$ in each of the first PC structure formation body 21A and the second PC structure formation body 21B. In the present embodiment, the value of the maximum amount of shift $\Delta p_{max}$ is represented by the ratio to the cycle length of the holes. Conditions other than the maximum amount of shift $\Delta p_{max}$ are the same as those in the photoelectric conversion apparatus of the first embodiment.

Figure 15:
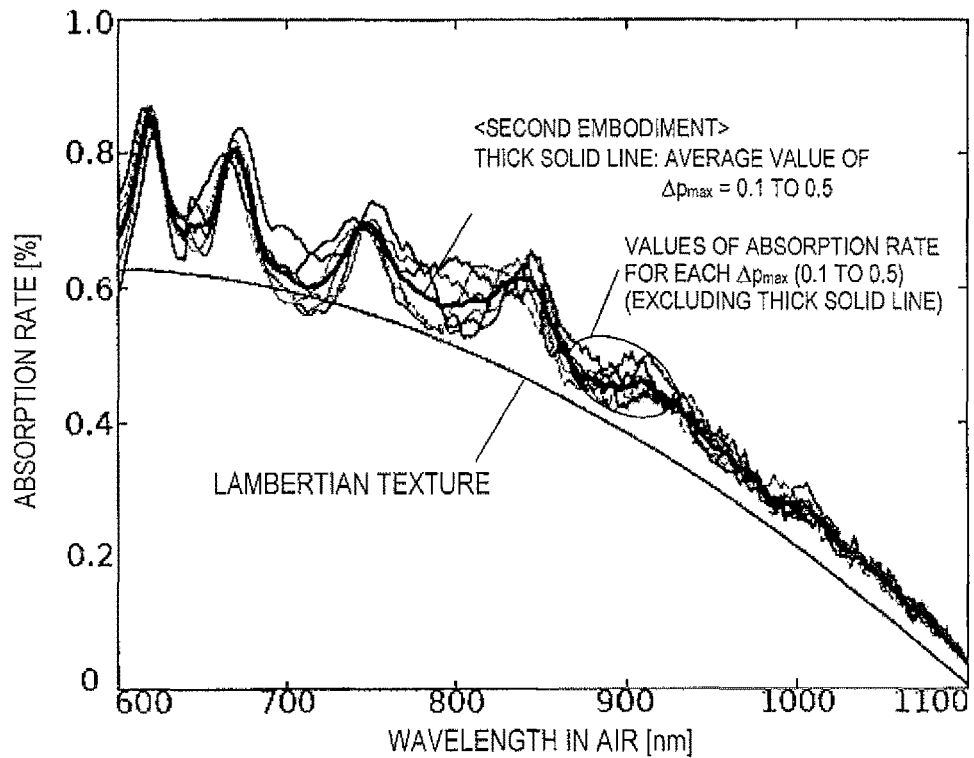
FIG. 15 is a graph showing results of calculating a light absorption rate for each wavelength, in the solar cell of the second embodiment and a solar cell of a comparative example.

FIG. 15 is a graph showing results of calculating the absorption rate for each wavelength within such a range that the maximum amount of shift $\Delta p_{max}$ is 0.1 to 0.5. A plurality of peaks is found in this graph. Compared with the first embodiment (FIG. 12A), in the present embodiment, no sharp peak top is found, but each peak width is larger, and the absorption rate does not drop at a particular wavelength over the entire wavelength range for this calculation.

Figure 16:
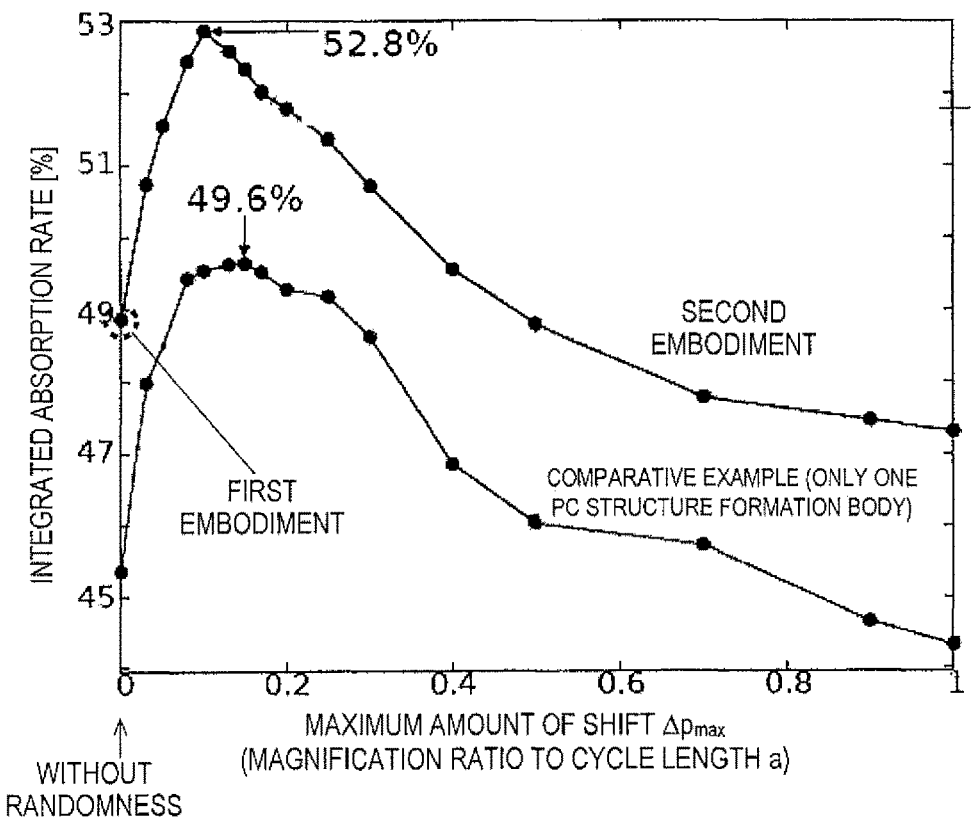
FIG. 16 is a graph showing results of calculating an integrated absorption rate, in the solar cell of the second embodiment and a solar cell of a comparative example.

FIG. 16 is a graph showing the relation between the integrated absorption rate and the maximum amount of shift $\Delta p_{max}$ in the second embodiment. This graph also shows the integrated absorption rate in the case of $\Delta p_{max}=0$, that is, the first embodiment. For comparison, this graph also shows a result of calculation for the case where only one PC structure formation body is provided. As is apparent from this graph, in the present embodiment, the integrated absorption rate is higher over the entire range of $\Delta p_{max}$ than that in the case where only one PC structure formation body is provided. Moreover, in the case where $\Delta p_{max}$ is equal to or less than 0.4, the integrated absorption rate is higher than that in the first embodiment.

(7) Embodiment of Diffraction Element According to Present Invention

Figure 17:
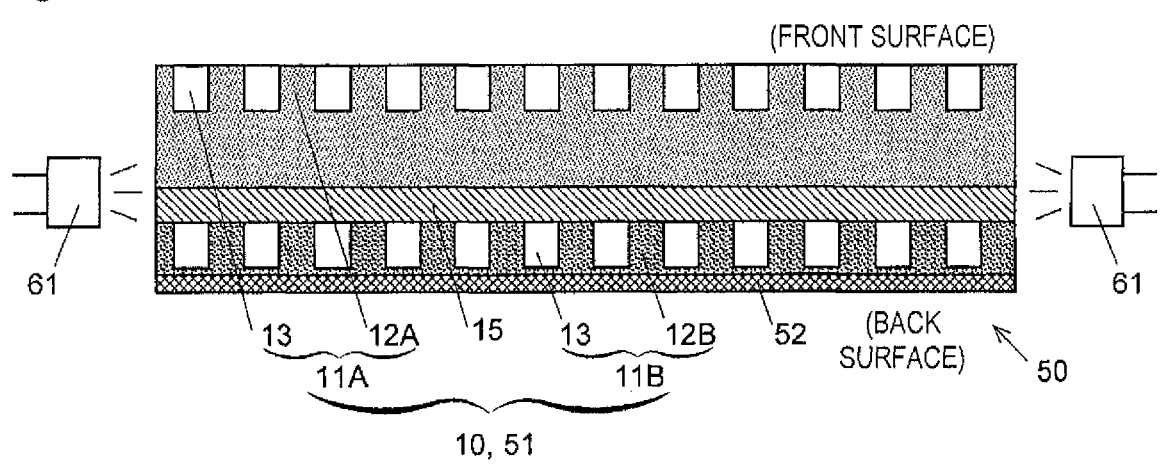
FIG. 17 is a longitudinal sectional view showing a light guide plate for which an embodiment of a diffraction element according to the present invention is used.

The photonic crystal of the present invention can be directly used as a light extraction element using a diffraction effect. With reference to FIG. 17, a light guide plate 50 is described as a specific example of using the diffraction element according to the present invention. The light guide plate 50 is used for, for example, an edge-lit backlight unit in a liquid crystal display. In general, in the edge-lit backlight unit, light is supplied to the entire back surface of a panel of the liquid crystal display through the light guide plate from a light source provided lateral to the panel, and the entire panel is irradiated with illumination light from the back surface.

As shown in FIG. 17, the light guide plate 50 of the present embodiment has a configuration in which a reflection plate 52 is provided to the surface of the second PC structure formation body 11B opposite to the spacer layer 15 in the photonic crystal 10. In the present embodiment, plastic such as acrylic, glass, and other materials that do not easily absorb visible light are used for the first plate-like member 12A and the second plate-like member 12B. In this configuration, the photonic crystal 10 has a role as a diffraction element 51. A light source 61 for visible light to be introduced into the diffraction element 51 is provided lateral to the light guide plate 50. The light source 61 is not a constituent element of the light guide plate 50, but constitutes a backlight unit together with the light guide plate 50.

In the light guide plate 50 of the present embodiment, when visible light is introduced into the diffraction element 51 from the light source 61, standing waves of light are formed at a large number of frequencies corresponding to the resonant frequencies of the photonic crystal 10. These standing waves are scattered by the holes 13 to be eventually emitted to the outside of the photonic crystal 10 from two surfaces of the photonic crystal 10. Here, light emitted on the side on which the reflection plate 52 is provided is reflected on the reflection plate 52, and hence all the rays of emitted light are emitted to the outside of the light guide plate 50 from the surface opposite to the side on which the reflection plate 52 is provided.

In the light guide plate 50 of the present embodiment, light having a large number of frequencies corresponding to the resonant frequencies of the photonic crystal 10 can be scattered with high probability, and hence the light emission efficiency of a backlight can be made higher.

REFERENCE SIGNS LIST 10, 10B, 10C, 10D, 20 . . . Photonic Crystal
11A, 21A . . . First Photonic Crystal (PC) Structure Formation body
11B, 21B . . . Second Photonic Crystal (PC) Structure Formation body
11C . . . Third Photonic Crystal (PC) Structure Formation body
12A . . . First Plate-like Member
12AN N type Semiconductor Layer
12AP . . . P type Semiconductor Layer
12B . . . Second Plate-like Member
12BN . . . N type Semiconductor Layer
12BP . . . P type Semiconductor Layer
13, 23 . . . Hole
15, 25 . . . Spacer Layer
151 . . . First Conductor Layer
152 . . . Second Conductor Layer
153 . . . Insulator Layer
30, 30A, 40 . . . Photoelectric Conversion Apparatus
31 . . . Photoelectric Conversion Layer
321, 421 . . . Transparent Electrode
322, 422 . . . Back-side Electrode 50 . . . Light Guide Plate
51 . . . Diffraction Element
52 . . . Reflection Plate

The invention claimed is:

1. A photonic crystal that resonates with light having a plurality of frequencies within a predetermined frequency range, comprising:
a plurality of photonic crystal structure formation bodies including a first photonic crystal structure formation body and a second photonic crystal structure formation body, the plurality of the photonic crystal structure formation bodies each including a plate-like member in which a single cyclic structure of cyclic refractive index distribution is formed, the plurality of the photonic crystal structure formation bodies being provided so as to be spaced apart from each other in a thickness direction of the plate-like member, wherein
the first photonic crystal structure formation body has a structure that is different from a structure of the second photonic crystal structure formation body such that cyclic refractive index distribution of the first photonic crystal structure formation body and cyclic refractive index distribution of the second photonic crystal structure formation body are different from each other; the first photonic crystal structure formation body has at least two cycles in the single cyclic structure of cyclic refractive index distribution and resonates with light having at least two resonant frequencies within the predetermined frequency range; the at least two resonant frequencies are different from all resonant frequencies of the second photonic crystal structure formation body; at least one of the resonant frequencies of the second photonic crystal structure formation body has a value between the two resonant frequencies; the cyclic refractive index distribution of each photonic crystal structure formation body is formed by arranging modified refractive index regions, each of the modified refractive index regions has a refractive index different from that of the plate-like member, such that each of the modified refractive index regions is randomly shifted by an amount of shift $\Delta p$ equal to or less than a maximum amount of shift $\Delta p_{max}$ (wherein $\Delta p_{max}$ is more than 0 and equal to or less than 0.4), in parallel to the plate-like member from each lattice point of a two-dimensional lattice parallel to the plate-like member; and the amount of shift $\Delta p$ of each of the modified refractive index regions is distributed within a range of 0 to $\Delta p_{max}$ and there is no rule for the distribution.

2. The photonic crystal according to claim 1, wherein a number of the plurality of the photonic crystal structure formation bodies is two.

3. The photonic crystal according claim 1, wherein the cyclic refractive index distribution of each photonic crystal structure formation body is formed by respectively arranging the modified refractive index regions, each of the modified refractive index regions has a refractive index different from that of the plate-like member, at lattice points of a two-dimensional lattice parallel to the plate-like member.

4. The photonic crystal according to claim 3, wherein the cyclic refractive index distribution of each photonic crystal structure formation body is formed such that a planar shape of each modified refractive index region has a random size between a minimum value and a maximum value.

5. An optical functional device comprising the photonic crystal according to claim 1.

6. A photoelectric conversion apparatus comprising a photoelectric conversion layer that is made of a semiconductor and is provided between a pair of electrodes, the photoelectric conversion layer being for converting light within the predetermined frequency range into electric power, wherein
the photonic crystal according to claim 1 is formed in the photoelectric conversion layer.

7. The photoelectric conversion apparatus according to claim 6, wherein
each of the plurality of the photonic crystal structure formation bodies is formed as a structure in which a p-type semiconductor and an n-type semiconductor are joined to each other, and
adjacent two photonic crystal structure formation bodies are spaced apart from each other by a spacer layer made of a conductor.

8. The photoelectric conversion apparatus according to claim 6, wherein
a number of the plurality of the photonic crystal structure formation bodies is two, and
one of the plurality of the photonic crystal structure formation bodies is made of a p-type semiconductor, whereas the other of the plurality of the photonic crystal structure formation bodies is made of an n-type semiconductor.

9. The photoelectric conversion apparatus according to claim 6, wherein
each of the plurality of the photonic crystal structure formation bodies is formed as a structure in which a p-type semiconductor and an n-type semiconductor are joined to each other, and
adjacent two photonic crystal structure formation bodies are spaced apart from each other by a spacer layer formed by laminating a first conductor layer, an insulator layer, and a second conductor layer in this order.

10. A diffraction element for scattering light within the predetermined frequency range, comprising the photonic crystal according to claim 1.

11. The photonic crystal according to claim 1, the first photonic crystal structure formation body and the second photonic crystal structure formation body each being provided with holes and each having structural characteristics, the structural characteristics of each of the first and second photonic crystal structure formation bodies including sizes of the holes, depth of the holes, distances between adjacent holes and thickness of the plate-like member,
wherein one or more structural characteristics of the first photonic crystal structure formation body are different from one or more structural characteristics of the second photonic crystal structure formation body.

12. The photonic crystal according to claim 1, wherein
the first photonic crystal structure formation body is made of a first type of silicon semiconductor having a first thickness and a first number of columnar holes, the holes having a same first radius and a same first depth and being distributed with a same first cycle length,
the second photonic crystal structure formation body is made of a second type of silicon semiconductor having a second thickness and a second number of columnar holes, the holes having a same second radius and a same second depth and being distributed with a same second cycle length, and
the first photonic crystal structure formation body and the second photonic crystal structure formation body are different due to at least one of (1) the first thickness being different from the second thickness, (2) the first radius being different from the second radius, (3) the first depth being different from the second depth, or (4) the first cycle length being different from the second cycle length.

13. A photonic crystal that resonates with light having a plurality of frequencies within a predetermined frequency range, comprising:
a plurality of photonic crystal structure formation bodies each including a plate-like member in which a single cyclic structure of cyclic refractive index distribution is formed, the plurality of the photonic crystal structure formation bodies being provided so as to be spaced apart from each other in a thickness direction of the plate-like member, wherein
cyclic refractive index distribution of a first photonic crystal structure formation body that is one of the plurality of the photonic crystal structure formation bodies and cyclic refractive index distribution a second photonic crystal structure formation body that is one of other photonic crystal structure formation bodies are set such that: the first photonic crystal structure formation body has at least two cycles in the single cyclic structure of cyclic refractive index distribution and resonates with light having at least two resonant frequencies within the predetermined frequency range; the at least two resonant frequencies are different from all resonant frequencies of the second photonic crystal structure formation body; and at least one of the resonant frequencies of the second photonic crystal structure formation body has a value between the two resonant frequencies,
the cyclic refractive index distribution of each photonic crystal structure formation body is formed by arranging modified refractive index regions, each of the modified refractive index regions has a refractive index different from that of the plate-like member, such that each of the modified refractive index regions is randomly shifted by an amount of shift $\Delta p$ equal to or less than a maximum amount of shift $\Delta p_{max}$ (wherein $\Delta p_{max}$ is more than 0 and equal to or less than 0.4), in parallel to the plate-like member from each lattice point of a two-dimensional lattice parallel to the plate-like member; and the amount of shift $\Delta p$ if each of the modified refractive index regions is distributed within a range of 0 to $\Delta p_{max}$ and there is no rule for the distribution.

* * * * *